United States Patent [19]

Dhong et al.

[11] Patent Number: 5,034,787
[45] Date of Patent: Jul. 23, 1991

[54] STRUCTURE AND FABRICATION METHOD FOR A DOUBLE TRENCH MEMORY CELL DEVICE

[75] Inventors: Sang H. Dhong, Mahopac; Wei Hwang, Armonk, both of N.Y.

[73] Assignee: International Business Machines Corporation, Armonk, N.Y.

[21] Appl. No.: 545,225

[22] Filed: Jun. 28, 1990

[51] Int. Cl.⁵ .................... H01L 29/78; H01L 29/06
[52] U.S. Cl. ................................. 357/23.6; 357/23.4; 357/51; 357/55; 357/41
[58] Field of Search .................... 357/23.6, 51, 41, 55, 357/23.4

[56] References Cited

U.S. PATENT DOCUMENTS

| | | | |
|---|---|---|---|
| 4,649,625 | 3/1987 | Lu | 29/571 |
| 4,672,410 | 6/1987 | Miura et al. | 357/23.6 |
| 4,713,678 | 12/1987 | Womack et al. | 357/23.6 |
| 4,728,623 | 3/1988 | Lu et al. | 437/52 |
| 4,751,557 | 6/1988 | Sunami et al. | 357/23.6 |
| 4,769,786 | 9/1988 | Garnache et al. | 365/182 |
| 4,786,954 | 11/1988 | Morie et al. | 357/23.6 |
| 4,791,463 | 12/1988 | Malhi | 357/23.6 |
| 4,797,373 | 1/1989 | Malhi et al. | 437/60 |
| 4,801,988 | 1/1989 | Kenney | 357/23.6 |
| 4,873,560 | 10/1989 | Sunami et al. | 357/23.6 |
| 4,916,524 | 4/1990 | Teng et al. | 357/23.6 |

FOREIGN PATENT DOCUMENTS

| | | |
|---|---|---|
| 0198590 | 10/1986 | European Pat. Off. . |
| 61-22665 | 1/1986 | Japan . |
| 63-17553 | 1/1988 | Japan . |
| 63-110770 | 5/1988 | Japan . |

Primary Examiner—Jerome Jackson, Jr.
Attorney, Agent, or Firm—John J. Goodwin

[57] ABSTRACT

A method is described for fabricating a novel double trench memory structure including a shallow trench access transistor adjacent to a deep trench storage capacitor. The described three-dimensional DRAM cell structure consists of shallow trench access transistors and deep trench storage capacitors in a n-well disposed on a semiconductor substrate. In the fabrication method, the vertical access transistors are built adjacent to the one side of one deep substrate-plate trench storage capacitor. Arrangement of the access transistors and trench storage capacitor are different from that of standard single trench cells. The layout of the double trench cell not only provides the advantages of small size, high packing density, lower soft error rate, and higher noise immunity for storage capacitor, but also leads to better performance and an efficient sensing scheme. The structure may be fabricated for p-channel or n-channel embodiments.

8 Claims, 5 Drawing Sheets

STRUCTURE AND FABRICATION METHOD FOR A DOUBLE TRENCH MEMORY CELL DEVICE

BACKGROUND OF THE INVENTION

1. Field of the Invention

The present invention relates to dynamic random access memory (DRAM) structures having individual memory cells including access transistors and storage capacitors, and more particularly to a structure and fabrication method for a three dimensional, double trench memory cell including a shallow trench access transistor and a deep trench storage capacitor.

2. Description of the Prior Art

U.S. Pat. No. 4,786,954 issued Nov. 22, 1988 to Morie et al, entitled DYNAMIC RAM CELL WITH TRENCH SURROUNDED SWITCHING ELEMENT, a semiconductor memory device is described which has a semiconductor substrate of one conductivity type in which a plurality of memory cells are formed, each of the plurality of memory cells including at least one capacitor and having a trench which is formed from one major surface of the semiconductor substrate so as to surround at least one memory cell, wherein a first insulating film having element isolation properties is formed on a bottom and most areas of side wall surfaces of the trench, a first conductive film serving as one electrode of the capacitor is formed on the side wall of the first insulating film and an exposed portion of the semiconductor substrate which is not covered with the first insulating film, a second insulating film is formed on the first conductive film, and a second conductive film serving as the other electrode of the capacitor is formed on the second insulating film.

U.S. Pat. No. 4,791,463 issued Dec. 13, 1988 to Malhi, entitled STRUCTURE FOR CONTACTING DEVICES IN THREE DIMENSIONAL CIRCUITRY, discloses the fabrication of a dRAM cell which is an important application of the present invention. The described cell provides a one-transistor/one-capacitor dRAM cell structure and array in which the cell transistor is formed on the side walls of a substrate trench containing the cell capacitor; the word and bit lines cross over this trench. This stacking of the transistor on top of the capacitor yields a cell with minimal area on the substrate and solves a problem of dense packing of cells. One capacitor plate and the transistor channel and source region are formed in the bulk side wall of the trench and the transistor gate and the other plate of the capacitor are both formed in polysilicon in the trench but separated from each other by an oxide layer inside the trench. The signal charge is stored on the polysilicon capacitor plate by an electrical connection of the source region with the polysilicon capacitor plate.

In U.S. Pat. No. 4,797,373 issued Jan. 10, 1989 to Malhi et al, entitled METHOD OF MAKING DRAM CELL WITH TRENCH CAPACITOR, a DRAM cell and array of cells, together with a method of fabrication, are disclosed wherein the cell includes one field effect transistor and one storage capacitor with both the transistor and the capacitor formed in a trench in a substrate. The transistor source, channel and drain and one capacitor plate are formed essentially vertically in the bulk substrate side walls of the trench, and the gate and other capacitor plate are formed in two regions of material inserted into the trench and isolated from the bulk by an insulating layer. Signal charge is stored on the capacitor material inserted into the trench by an electrical connection of the bulk substrate source to the capacitor material through the insulating layer. Word lines on the substrate surface connect to the upper of the inserted regions which forms the gate, and bit lines on the substrate surface form the drains. The trenches and cells are formed at the crossings of bit lines and word lines; the bit lines and the word lines form perpendicular sets of parallel lines.

U.S. Pat. No. 4,801,988 issued Jan. 31, 1989 to Kenney, entitled SEMICONDUCTOR TRENCH CAPACITOR CELL WITH MERGED ISOLATION AND NODE TRENCH CONSTRUCTION, discloses a semiconductor trench capacitor construction having a self-aligned isolation structure formed within the trench. The trench isolation structure consists of a thick isolating layer formed along the upper portion of the trench side walls. The trench isolation structure facilitates larger capacitor constructions and allows the capacitors to abut adjacent capacitors and other devices.

Japanese Patent No. 63-17553 issued Jan. 25, 1980 to Ikhijima, entitled SEMICONDUCTOR MEMORY STORAGE AND ITS MANUFACTURE, describes a memory cell having fine structure by forming not only a capacitor for the memory cell but also a memory transistor on the side surface of a columnar region in a semiconductor substrate.

Japanese Patent No. 61-22665 issued Jan. 31, 1986 to Murata, entitled SEMICONDUCTOR INTEGRATED CIRCUIT DEVICE, discloses a technique to reduce the occupying area of a switching element and a capacitance element by a method wherein a small hole which is formed in the inner direction from the main surface on the main surface part of a semiconductor base plate, and a switching element and a capacitance element are buried in the small hole.

Japanese Patent No. 63-110770 dated May 16, 1988, entitled SEMICONDUCTOR DYNAMIC RAM, discloses a structure that includes a unit memory cell in a shallow trench formed in a deep trench.

European Patent Application No. 86301758.8 filed Mar. 11, 1968, entitled SEMICONDUCTOR MEMORY DEVICE, shows a MOS capacitor buried in a groove in a substrate.

In U.S. Pat. No. 4,649,625 issued Mar. 17, 1987 to Lu, entitled DYNAMIC MEMORY DEVICE HAVING A SINGLE-CRYSTAL TRANSISTOR ON A TRENCH CAPACITOR STRUCTURE AND A FABRICATION METHOD THEREFOR, dynamic random access memory (DRAM) devices are taught wherein individual cells, including an access transistor and a storage capacitor, are formed on a single-crystal semiconductor chip, and more particularly, a three-dimensional dynamic random access memory (DRAM) device structure is described having a single-crystal access transistor stacked on top of a trench capacitor and a fabrication method therefor wherein crystallization seeds are provided by the single-crystal semiconductor area surrounding the cell and/or from the vertical side walls of the trench and wherein the access transistor is isolated by insulator.

In U.S. Pat. No. 4,672,410 issued June 9, 1987 to Miura et al, entitled SEMICONDUCTOR MEMORY DEVICE WITH TRENCH SURROUNDING EACH MEMORY CELL, a semiconductor device is described that has memory cells respectively located at intersections of bit and word lines arranged in a matrix form, each of the memory cells being constituted by a single insulated gate transistor and a single capacitor. One memory cell is formed in an element formation region defined by each of trenches arranged in a matrix form. The capacitor has an insulating film formed along part of a side wall surface of a trench formed in at least a direction of thickness of a semiconductor substrate and a conductive layer formed along the insulating film. The transistor has a gate insulating film adjacent to the capacitor and formed along a remaining portion of the side wall surface of the trench, a gate electrode formed along the gate insulating film, and a diffusion region formed in a major surface of the semiconductor substrate which is adjacent to the gate insulating film.

In U.S. Pat. No. 4,713,678 issued Dec. 15, 1987 to Womack et al, entitled DRAM CELL AND METHOD, a DRAM cell and array of cells, together with a method of fabrication, are disclosed wherein the cell includes one field effect transistor and one storage capacitor with the capacitor formed in a trench in a substrate and the transistor channel formed by epitaxial growth on the substrate. The transistor source and drain are insulated from the substrate, and the transistor may be adjacent the trench or on the upper portion of the trench side walls. Signal charge is stored on the capacitor plate insulated from the substrate.

U.S. Pat. No. 4,728,623 issued Mar. 1, 1988 to Lu et al, entitled FABRICATION METHOD FOR FORMING A SELF-ALIGNED CONTACT WINDOW AND CONNECTION IN AN EPITAXIAL LAYER AND DEVICE STRUCTURES EMPLOYING THE METHOD, discloses a fabrication process for providing an epitaxial layer on a silicon substrate and over predefined insulator-capped islands which forms a self-aligned contact window in the epitaxial layer. Application of the method to a three-dimensional dynamic random access memory (DRAM) device structure is shown, with an access transistor formed in monocrystalline silicon stacked on top of a trench capacitor. A fabrication method therefor is shown wherein the contact window for the source-to-trench connection is formed by self-aligned lateral epitaxial growth, followed by a contact-connection formation step using either a second epitaxial growth or a CVD refill and strapping process.

U.S. Pat. No. 4,751,557 issued June 14, 1988 to Sunami et al, entitled DRAM WITH FET STACKED OVER CAPACITOR, describes a semiconductor memory wherein a part of each capacitor is formed on side walls of an island region surrounded with a recess formed in a semiconductor substrate, and the island region and other regions are electrically isolated by the recess.

In U.S. Pat. No. 4,769,786 issued Sep. 6, 1988 to Garnache et al, entitled TWO SQUARE MEMORY CELLS, a memory is provided which includes a semiconductor substrate having a major surface and a trench disposed therein having a longitudinal axis, storage means disposed on a given side wall of the trench, switching means having a control element and a current carrying element disposed on the given side wall of the trench between the storage means and the major surface of the substrate and coupled to the storage means, a first electrically conductive line disposed on the given side wall in contact with the control element of the switching means and having a longitudinal axis arranged parallel to the longitudinal axis of the trench, and a second electrically conductive line disposed on the major surface of the semiconductor substrate in contact with the current carrying electrode of the switching means and having a longitudinal axis arranged orthogonal to the longitudinal axis of the trench.

SUMMARY OF THE INVENTION

A method for fabricating a novel double trench memory structure including a shallow trench access transistor and a deep trench storage capacitor. The new three-dimensional DRAM cell structure consists of shallow trench access transistors and deep trench storage capacitors. In the fabrication method, the vertical access transistors are built adjacent to the one side of one deep substrate-plate trench storage capacitor. Arrangement of the access transistors and trench storage capacitor are different from that of standard single trench cells. The layout of the double trench cell not only provides the advantages of small size, high packing density, lower soft error rate, and higher noise immunity for storage capacitor, but also leads to better performance and an efficient sensing scheme.

DESCRIPTION OF THE PREFERRED EMBODIMENT

Figure 1:
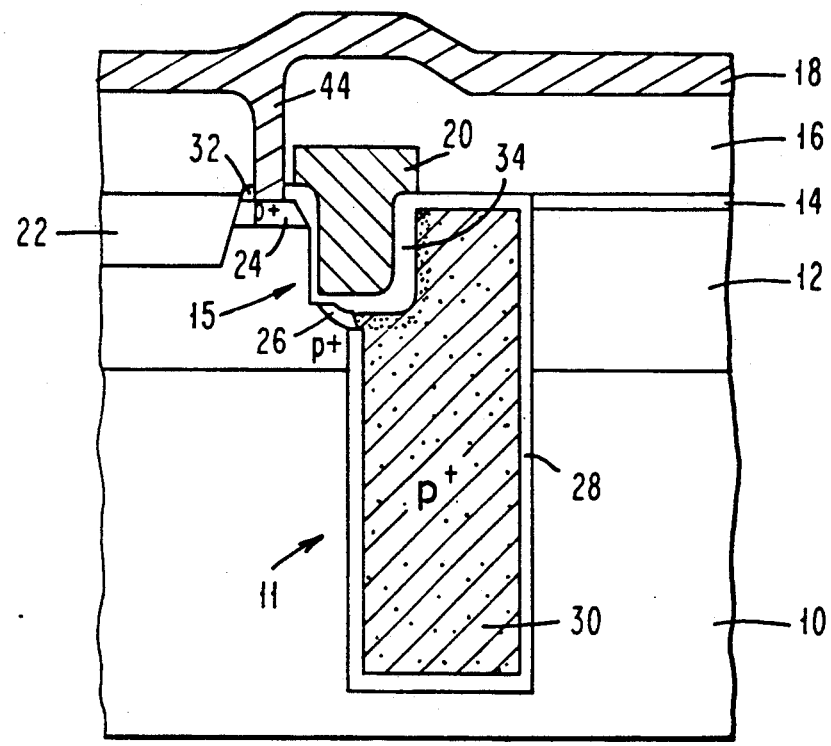
FIG. 1 is a schematic illustration of a cross-sectional side view of a three dimensional, double trench dynamic random access memory storage cell according to the principles of the present invention.
Figure 2:
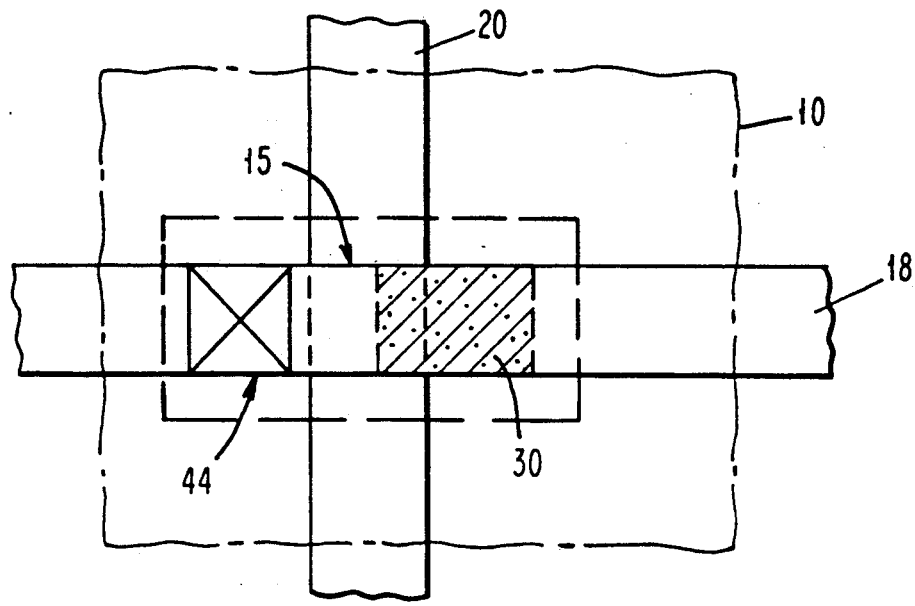
FIG. 2 is a schematic illustration of a plan view of the top of the three dimensional double trench dynamic random access memory storage cell shown in FIG. 1.

In the development of DRAM technology, cell density is continuously increasing, and the cell area occupied by the access transistor and storage capacitor is continuously scaling down. The capacitance requirements of a cell in terms of signal development and alpha-particle-induced soft errors immunity are incompatible with small cell area unless a vertical trench storage capacitor is used. The vertical transistor will replace the planar access transistor in order to achieve ultra high density memory design. In the present invention, a new three dimensional DRAM cell structure which consists of a shallow trench access transistor and a deep trench storage capacitor, and fabrication method therefor is provided. The structure will be referred to herein as a double trenches (DT) cell. The cross section of this new DT cell is schematically shown in FIG. 1 and a plan (top) schematic view of its layout is shown in FIG. 2. The vertical access transistors are built adjacent to the one side of one deep substrate-plate trench storage capacitor. Arrangement of the access transistors and trench storage capacitor are different from that of standard single trench cells. The layout of the DT cell not only provides the advantages of small size, high packing density, lower soft error rate, and higher noise immunity for storage capacitor, but also leads to better performance and sensing scheme.

Referring to FIG. 1, a schematic cross section illustration of the side view of an embodiment of a DT cell is shown including a substrate 10 of P-epitaxial material on p+ silicon. A deep trench 11 is disposed in the substrate 10 to serve as a storage capacitor region. Layer 14 is a composite layer composed of pad silicon oxide and nitride and functions as an insulator layer. The n-type dopants are implanted trhough the composite layer 14, on the substrate 10 to form n-well 12 region.

A shallow trench 15 is disposed in the n-well 12 region to provide for an access transistor device. The access transistor device located in shallow trench 15 includes a p+ junction 24 which functions as the source element, a p+ junction 26 that functions as the device drain element, and p+ polysilicon or tungsten material 20 which functions as the transfer gate and word line.

Silicon dioxide layers 32 and 34 serve as recessed isolation regions as does region 22. The deep trench storage capacitor region 11 includes a composite dielectric layer composed of thin oxide and nitride layers 28 which serves as a storage capacitor insulator. The deep trench is filled with p+ polysilicon 30 which functions as the storage capacitor plate element.

A layer of insulation 16 is disposed over the polysilicon gate, and a metal bit line 18, such as aluminum, is located over the structure with a contact 44 through the recessed isolation 32 to the source element 24.

In FIG. 2, a plan view of the structure of FIG. 1 is shown showing the transfer gate and word line 20 and the bit line 18 with the bit line contact 44. The shallow trench region 15 is shown as well as the deep trench capacitor region 30.

The fabrication procedures of the DT cell include the following process steps.

Step (1) Begin with a wafer with p− epi on p+ substrate 10.

Step (2) Form a composite layer of pad oxide and silicon nitride.

Figure 3:
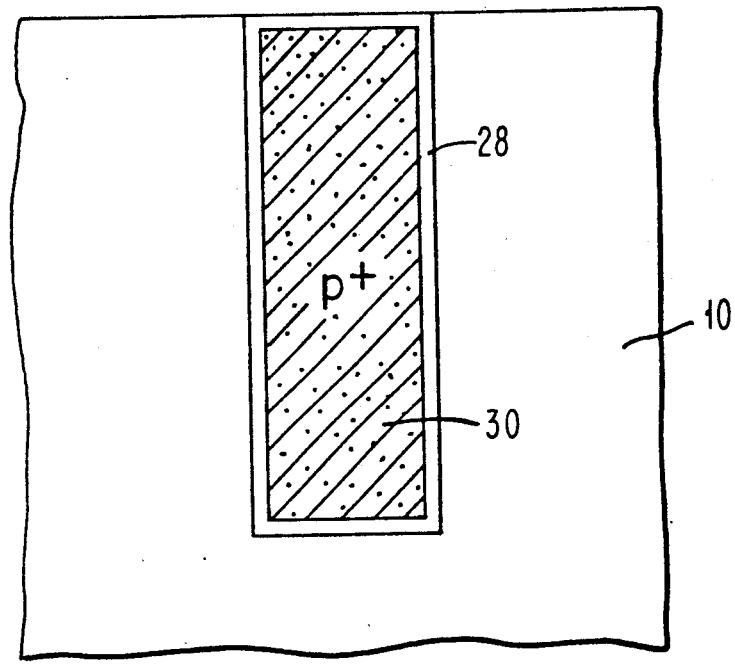
FIGS. 3, 4, 5, 6, 7, 8 9 and 10 are schematic illustrations of cross-sectional side view of the structure of FIG. 1 during various steps in the fabrication method therefor according to the principle of the present invention.

Step (3) After suitable lithography steps, make an opening in the composite layer. The portion of composite layer which remains is then used to mask the etch of a trench into substrate by RIE (reactive ion etching) to define the storage capacitor region 11 in FIG. 3.

Step (4) Strip the silicon-dioxide film and regrow a thin oxide/nitride composite layer 28 in trench capacitor to produce the storage capacitor insulator. Fill the trench with chemical-vapor-deposition (CVD) p+ polysilicon plug 30. Remove the excess polysilicon not located above the trench by using chemical-mechanical polishing techniques to provide the structure shown in FIG. 3.

Step (5) Form a composite layer of silicon oxide and nitride 14. Pattern and etch layer 14, after suitable lithography and photoresist steps, to form an opening in the photoresist layer to expose the regions for n-well formation.

Figure 4:
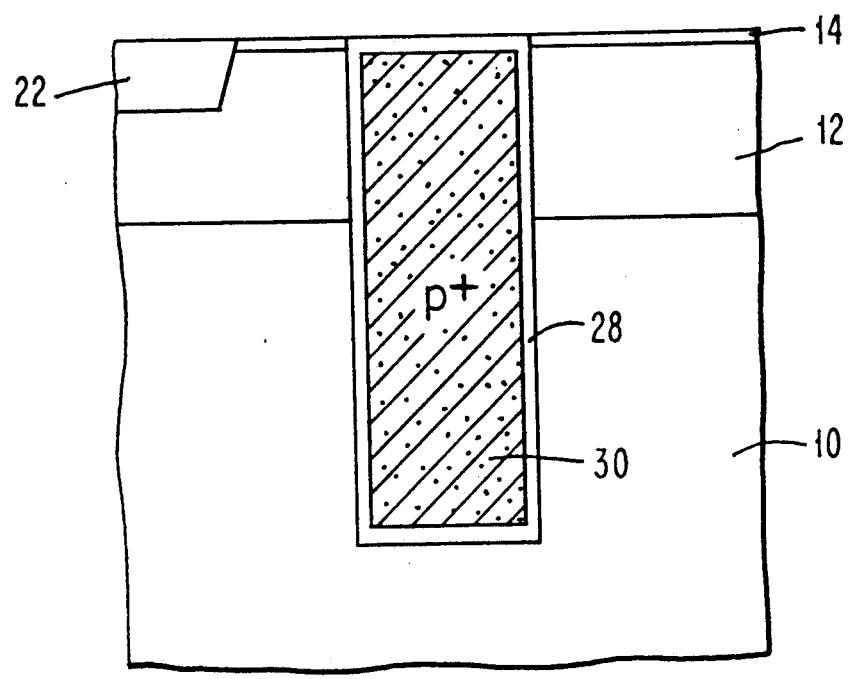

Step (6) Implant n-type dopants through the composite layer on the substrate to form n-well regions 12 as shown in FIG. 4. Portions of the photoresist layer outside the n-well region blocks the n-type implantation into the n-channel device regions.

Step (7) Remove the photoresist and carry out a short thermal cycle to drive in the n-type dopant into the substrate to form region 12.

Step (8) Form another composite layer of silicon oxide and nitride 14 then pattern and etch shallow isolation trench by RIE.

Step (9) Grow and deposit an oxide layer 22 to fill the shallow trench. Use RIE or chemical-mechanical polishing planarization technique to result in a coplanar surface between the oxide isolation 22 and structure surface. The composite layer 14 of pad oxide and nitrides are then removed. As a result, oxide isolation regions are formed so that the access devices can be isolated as shown in FIG. 4.

At this point, the n-well region 12, the isolation region 22 and p-channel vertical FET device regions are then fabricated in combination with state-of-the-art CMOS and trench technologies to produce the structure shown in FIG. 1, which is described in the next following steps.

Step (10) Form a layer of silicon oxide on the structure. After suitable mask and lithography steps, an opening is made in the silicon oxide layer. The layer which remains is then used to mask the etch.

Figure 5:
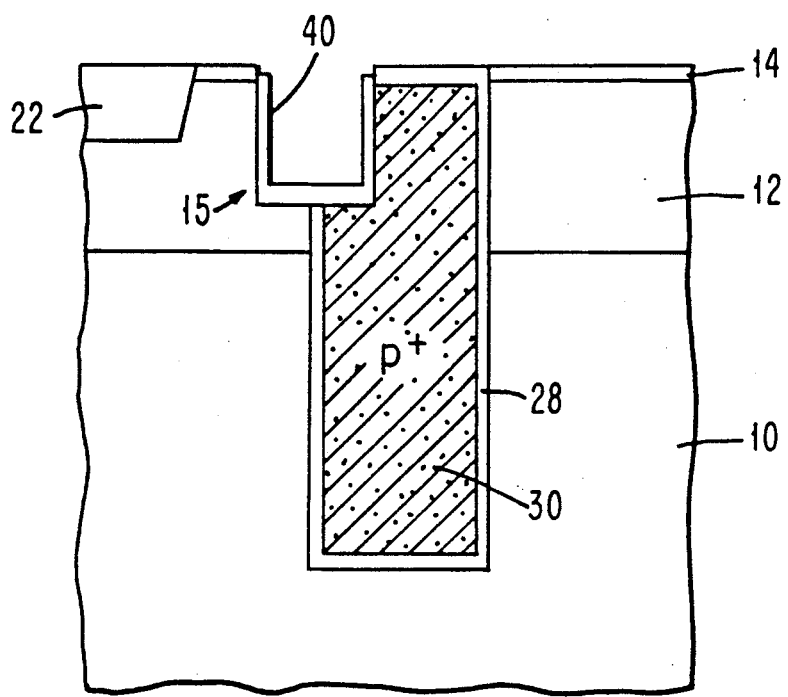

Step (11) Etch a shallow trench 15 in the n-well regions by RIE to form vertical access transistor region as shown in FIG. 5.

Step (12) Grow a thin selective epi-layer 40 along inside shallow trench 15.

Step (13) Grow thin pad oxide 43.

Figure 6:
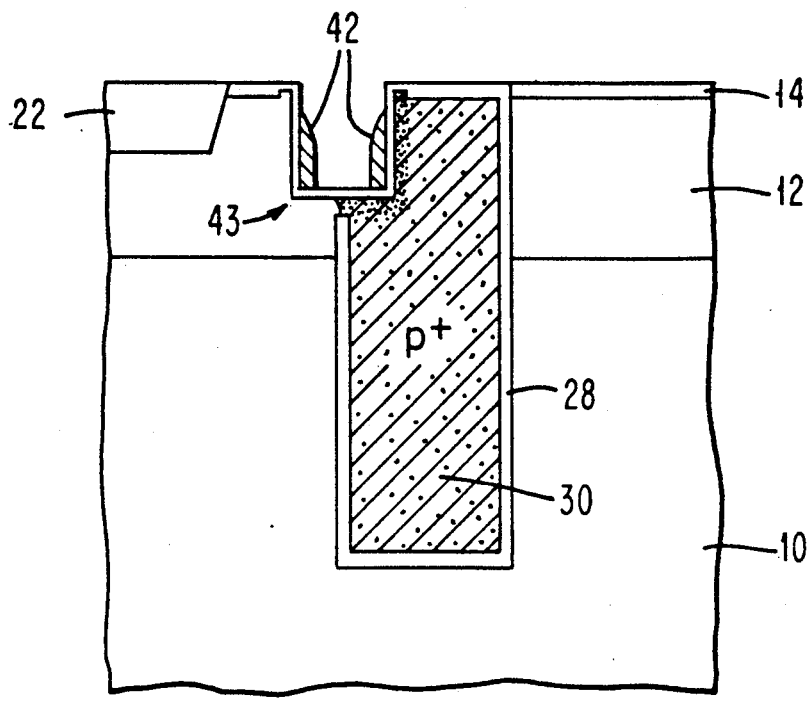

Step (14) A silicon nitride layer is then chemically deposited over the shallow trench and the surface of the substrate and Step (15) The side wall silicon nitride spacers 42 are formed by RIE nitride at proper treatments as shown in FIG. 6.

Figure 7:
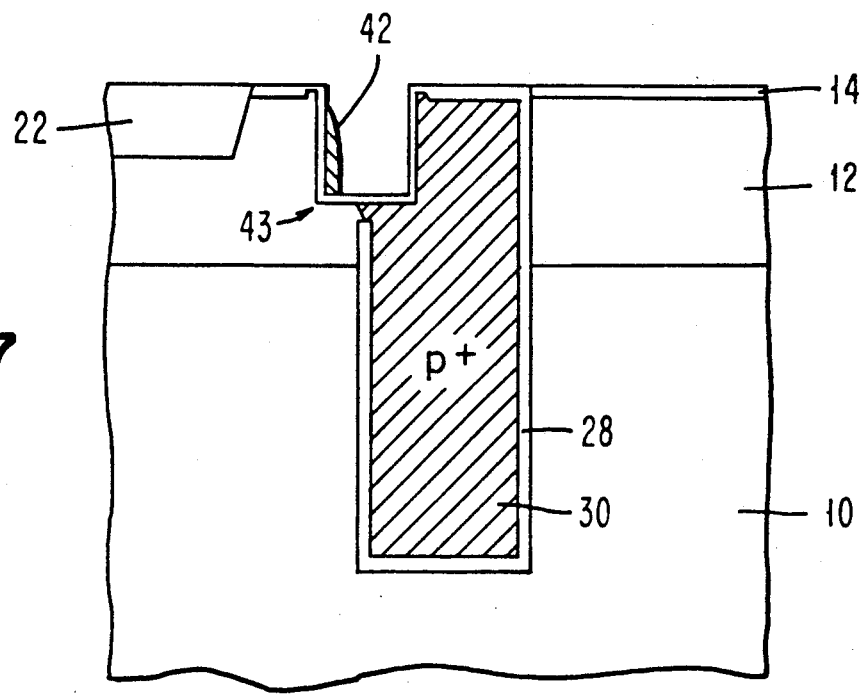

Step (16) After suitable lithography steps, one of the side wall silicon nitride spacers 42 is removed as shown in FIG. 7. This step is optional. Removing one side of the spacer 42 has the advantage of decreasing the overlap capacitance between the word line and storage node.

Figure 8:
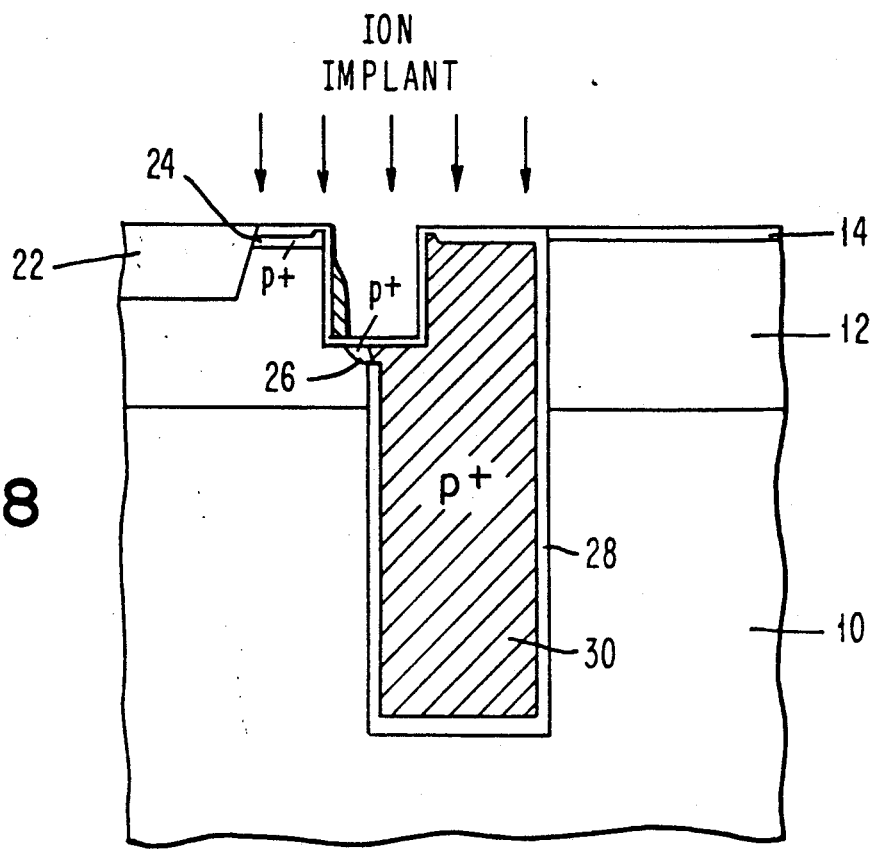

Step (17) P-type dopants are implanted through the composite layer on the surface of shallow trench 15 and n-well layer 12 to form p+ source 24 and p+ drain 26 junctions of the p-channel (PMOS) trench transistor as shown in FIG. 8.

Figure 9:
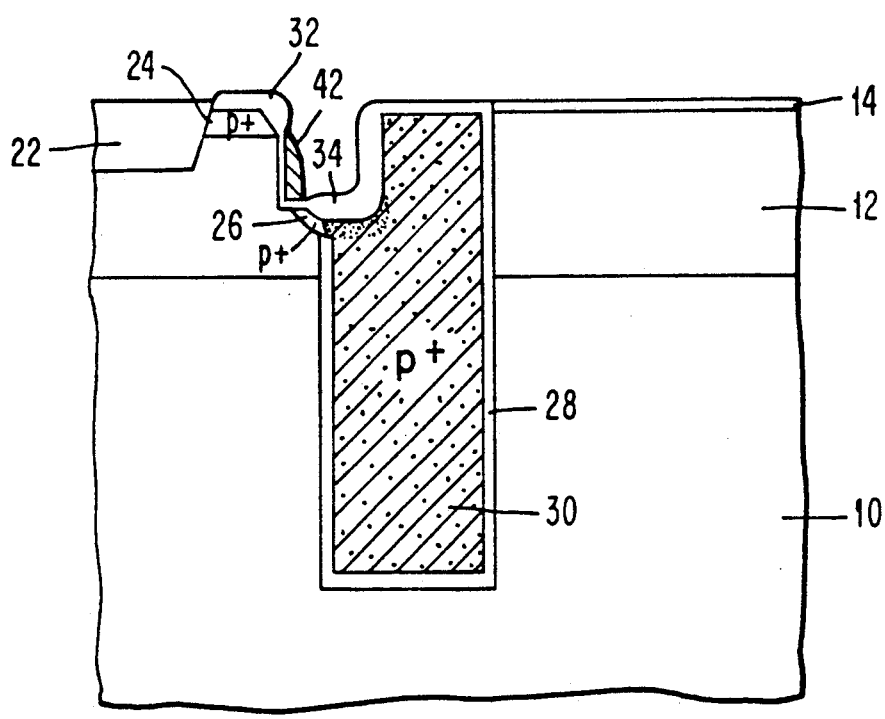

Step (18) Grow oxide 32 and 34 on the vertical walls of the shallow trench 15 and on the other areas as shown in FIG. 9.

Step (19) Remove the nitride spacer 42 and the pad oxide and grow a thin gate oxide on the vertical walls at the shallow trench 15 and other recessed isolation areas 32 and 34.

Step (20) Perform n+ doping at the side wall of the shallow trench 15 to control the p-channel threshold voltage by using an oblique ion implantation technique.

The ion incident implantation angle is adjusted according to aspect ratio of the trench. This step is not mandatory.

Figure 10:
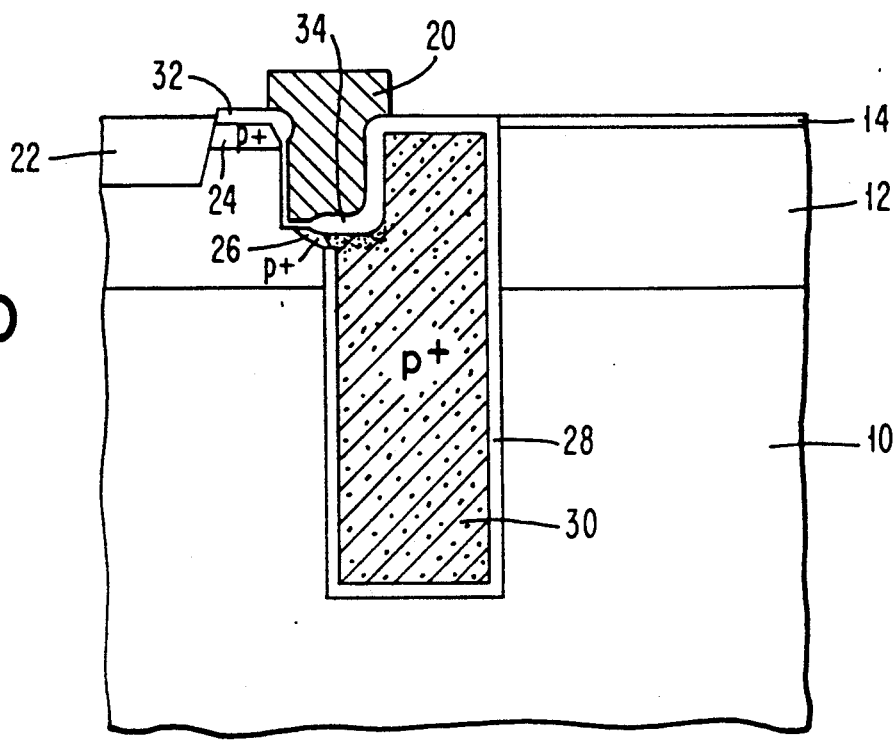

Step (21) Fill shallow trench 15 with CVD p+ polysilicon or metal (e.g., tungsten) and chem-mech polish and pattern to form the transfer gate and word lines as shown in FIG. 10. The rest of the fabrication processes to form the bit line contacts 44 with or without border and other steps are kept the same as standard CMOS technology to complete the cell fabrication procedures and will be obvious to one skilled in the art. The final cross section of the DT cell is as shown in FIG. 1.

It should be understood that the memory cell of the present invention can be made n-channel device without loss of generality by reversing the dopant polarity of polysilicon trench fill, forming a p-type "well" region in substrate, and forming n-channel FET devices as transfer devices in the p-type well.

Having thus described our invention, what we claim as new and desire to secure by Letters Patents is:

1. A double trench semiconductor memory storage structure comprising:
   a substrate of semiconductor material including a lower layer of silicon and an upper layer of epitaxial silicon,
   a first trench formed in said upper and lower layers of said semiconductor substrate, said first trench including a bottom wall and side wall portions, said bottom wall and side walls having a dielectric layer disposed thereon to form a storage capacitor insulator,
   a storage capacitor plate element composed of conductive material disposed in said first trench,
   a second trench formed in said upper layer of said semiconductor substrate adjacent to and partially disposed in a portion of said first trench, said second trench being disposed in an off-set position relative to said first trench wherein a first portion of said second trench is disposed in said first trench and a second portion of said second trench is disposed in said layer of epitaxial silicon,
   said second trench including bottom and side walls having a layer of dielectric material disposed thereon, wherein a portion of said bottom wall and a side wall of said second trench are in contact with said conductive material in said first trench, and wherein said layer of dielectric material disposed on said portion of said bottom wall and said side wall of said second trench in contact with said layer of epitaxial silicon is substantially thicker than the layer of epitaxial silicon is substantially thicker than the layer of dielectric material on the portion of said bottom wall and sidewall not in contact with said conductive material,
   a vertical access transistor device transfer gate and word line element composed of conductive material disposed in said second trench,
   wherein said substantially thicker layer of dielectric material is disposed between said conductive material in said second trench and said conductive material in said first trench for electrical isolation,
   a vertical access transistor device source element disposed in said upper layer of said substrate in contact with one of said side walls of said second trench,
   a vertical access transistor device drain element disposed in said upper layer of said substrate in contact with said bottom wall of said second trench and with said conductive material in said first trench.

2. A double trench semiconductor memory storage structure according to claim 1 wherein said conductive material in said second trench extends higher than the upper substate layer and higher than said side walls of said second trench to provide a memory word line element.

3. A double trench semiconductor memory storage structure according to claim 2 further including a layer of word line insulating material disposed over said upper layer of said substrate and said conductive word line element material, said layer of insulating material including an opening therein above said source element to provide access to said source element, and
   a layer of conductive material disposed over said layer of word line insulating material to form a memory bit line element, said conductive bit line material extending through said opening in said word line insulating material to contact said source element.

4. A double trench semiconductor memory storage structure according to claim 3 wherein said upper layer of epitaxial silicon of said substrate has a first semiconductive conductivity and includes a well region therein composed of second conductivity dopants opposite to said first conductivity and wherein said first and second trenches are disposed in said well region of said upper layer.

5. A double trench semiconductor memory storage structure according to claim 4 wherein said substrate is composed of an upper layer of p-conductivity epitaxial material on a lower layer of p+ silicon.

6. A double trench semiconductor memory storage structure according to claim 4 wherein said conductive material disposed in said first and second trench is p+ conductivity polysilicon.

7. A double trench semiconductor memory storage structure according to claim 4 wherein said source element and said drain element are composed of p+ conductivity junction material.

8. A double trench semiconductor memory storage structure according to claim 4 wherein said well region is composed of n+ doped silicon in said p-epitaxial layer.

* * * * *